(12) United States Patent
Zangooie et al.

(10) Patent No.: US 7,477,365 B2
(45) Date of Patent: Jan. 13, 2009

(54) OPTICAL SPOT GEOMETRIC PARAMETER DETERMINATION USING CALIBRATION TARGETS

(75) Inventors: Shahin Zangooie, Hopewell Junction, NY (US); Roger M. Young, Warwick, NY (US); Lin Zhou, LaGrangeville, NY (US); Clemente Bottini, Marlboro, NY (US); Ronald D. Fiege, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/828,666

(22) Filed: Jul. 26, 2007

(65) Prior Publication Data

US 2008/0024781 A1 Jan. 31, 2008

(51) Int. Cl.
*G01J 1/00* (2006.01)
*G01B 11/26* (2006.01)
*G01B 11/24* (2006.01)
*G01B 11/30* (2006.01)
*G01C 1/00* (2006.01)

(52) U.S. Cl. .................. 356/121; 356/138; 356/601

(58) Field of Classification Search .......... 356/388–398
See application file for complete search history.

(56) References Cited

U.S. PATENT DOCUMENTS

| | | | | | |
|---|---|---|---|---|---|
| 4,269,103 | A | * | 5/1981 | Underwood | 84/726 |
| 5,144,498 | A | * | 9/1992 | Vincent | 359/885 |
| 6,008,920 | A | * | 12/1999 | Hendrix | 398/79 |
| 7,310,153 | B2 | * | 12/2007 | Kiesel et al. | 356/519 |
| 7,345,764 | B2 | * | 3/2008 | Bulovic et al. | 356/419 |
| 2006/0039009 | A1 | * | 2/2006 | Kiesel et al. | 356/519 |

* cited by examiner

*Primary Examiner*—L. G. Lauchman
*Assistant Examiner*—Jarreas C Underwood
(74) *Attorney, Agent, or Firm*—Rosa Suazo Yaghmour; Hoffman Warnick LLC (57) ABSTRACT

A method, system and computer program product for determining a geometric parameter of an optical spot of a light beam are disclosed. A method comprises: providing a calibration target, the calibration target including a systematic variation in a parameter; measuring the calibration target with respect to the systematic variation using the light beam to obtain a plurality of measurements; and analyzing the measurements and the systematic variation to determine the geometric parameter of the optical spot.

7 Claims, 7 Drawing Sheets

FIG. 7

# OPTICAL SPOT GEOMETRIC PARAMETER DETERMINATION USING CALIBRATION TARGETS

BACKGROUND OF THE DISCLOSURE

1. Technical Field

The present disclosure relates in general to a processing system, and more particularly to determining a geometric parameter of an optical spot of a light beam of an optical metrology tool used in the processing system.

2. Background Art

Utilization of optical metrology in semiconductor manufacturing has grown significantly over the past several years. The technology provides capabilities to conduct measurements of a wide variety of critical device parameters, including, e.g., critical dimensions, depths and sidewall angles. Benefits of optical metrology include non-contact measurement capability that can be performed very quickly.

For optical metrology tools to yield reliable measurements, it is necessary that the tools produce well defined light beams, and collect the optical response for analysis, as designed. The size of the optical spot of the produced light beam, which is defined as the area illuminated by the incident light beam, can have a large impact on the measurement values. As a consequence, for example, the sizes of the optical spots of optical metrology tools affects the matching performance of the optical metrology tools.

An optical spot can initially appear to be symmetric. An optical spot may have an area (usually referred to as an "effective spot") inside the optical spot, which provides most, e.g., 99%, of the information content. An effective spot is very sensitive to the small change in the area it illuminates. Usually, an effective spot comprises a small portion of a total optical spot. For example, the entire optical spot may illuminate an area of 1600 square microns, while the most sensitive area of the optical spot (i.e., the effective spot) may be a 100 square micron area. If the optical spot is symmetric, the effective spot will be located in the center of the optical spot. If the optical spot is not symmetric, then the effective spot will be located off the center of the optical spot. Whether an optical spot of an optical metrology tool is symmetric and the level of symmetry impact the measurement result and thus the matching of the optical metrology tools.

Conventional approaches to optical metrology do not have a satisfactory solution to characterize a geometric parameter of an optical spot and or or a level of symmetry of the optical spot.

SUMMARY

A first aspect of the disclosure is directed to a method for determining a geometric parameter of an optical spot of a light beam, the method comprising: providing a calibration target, the calibration target including a systematic variation in a parameter; measuring the calibration target with respect to the systematic variation using the light beam to obtain a plurality of measurements; and analyzing the measurements and the systematic variation to determine the geometric parameter of the optical spot.

A second aspect of the disclosure is directed to a system for determining a geometric parameter of an optical spot of a light beam, the method comprising:

means for controlling a calibration target, the calibration target including a systematic variation in a parameter; means for measuring the calibration target with respect to the systematic variation using the light beam to obtain a plurality of measurements; and means for analyzing the measurements and the systematic variation to determine the geometric parameter of the optical spot.

A third aspect of the disclosure is directed to a calibration target for measuring a size of an optical spot of a light beam, the calibration target comprising: a first portion, a dimension of which in a first axis systematically decreases along a second axis; a second portion; and a third portion; wherein the second portion and the third portion extend along opposite sides of the first portion and are separated by the first portion in the first axis, and include a material of different optical response than that of the first portion.

A fourth aspect of the disclosure is directed to a calibration target for measuring a level of symmetry of an optical spot of a light beam, the calibration target comprising: a gradient in a parameter along an axis of the calibration target, the gradient being a function of the axis, and including one of: a continuous gradient from one end of the calibration target to another end thereof in the axis; or a switch point in a given point of the calibration target in the axis between two sub-gradients, one of the two sub-gradients being an ascending gradient and the other being a descending gradient.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION OF THE DISCLOSURE

The following detailed description of embodiments refers to the accompanying drawings, which illustrate specific embodiments of the disclosure. Other embodiments having different structures and operations do not depart from the scope of the present disclosure.

1. System Overview

Figure 1:
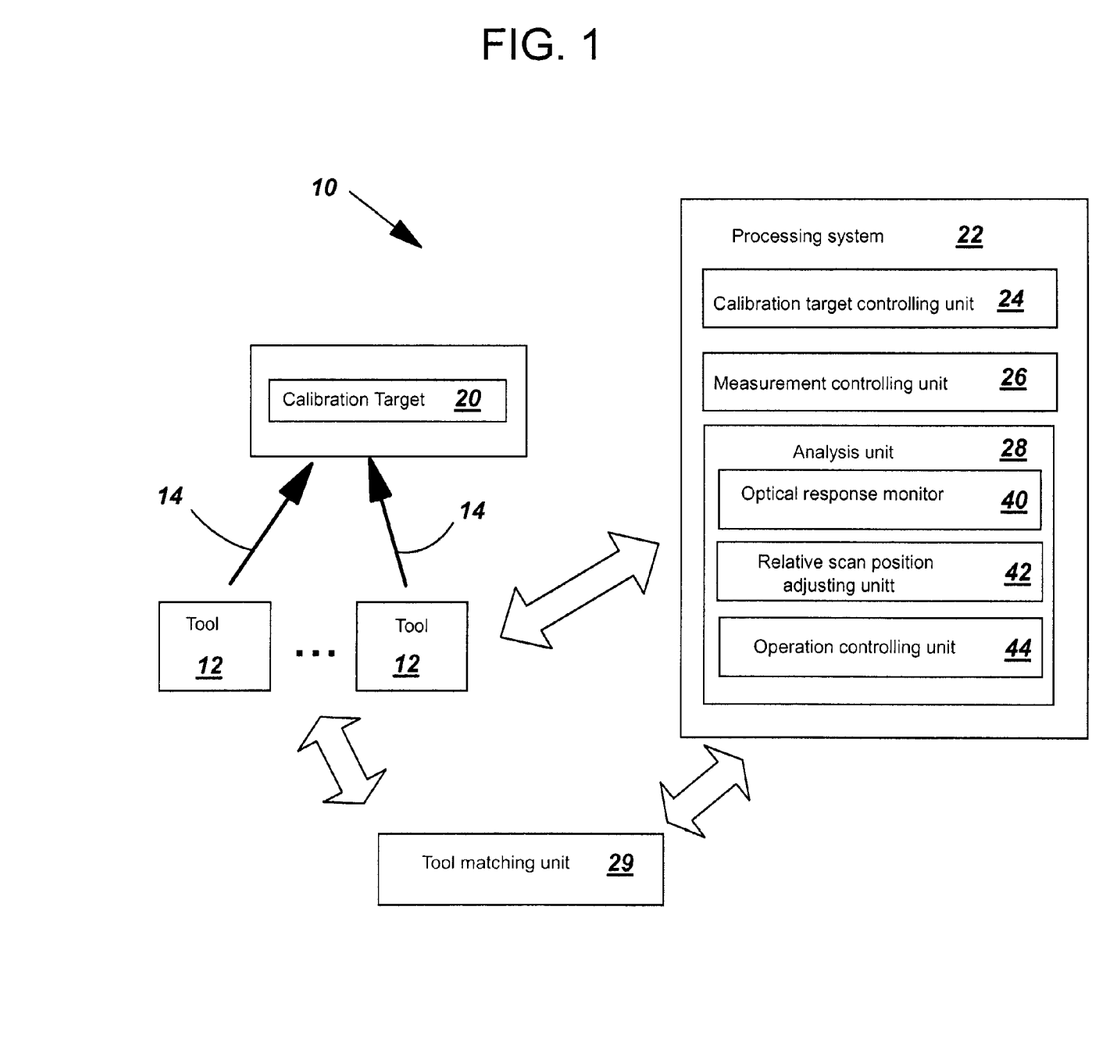
FIG. 1 shows a block diagram of a system according to the disclosure.

FIG. 1 shows a block diagram of a system 10 according to an embodiment of the invention. System 10 includes multiple optical metrology tools (tool) 12. Each tool 12 can produce a light beam 14 having an optical spot 16 (shown in FIG. 2) on a calibration target 20. System 10 includes a processing system 22 including a calibration target controlling unit 24, a measurement controlling unit 26, an analysis unit 28 including an optical response monitor 40, a relative scan position adjusting unit 42 and an operation controlling unit 44. System 10 also includes a tool matching unit 29.

2. Measuring Optical Spot Size

Figure 2:
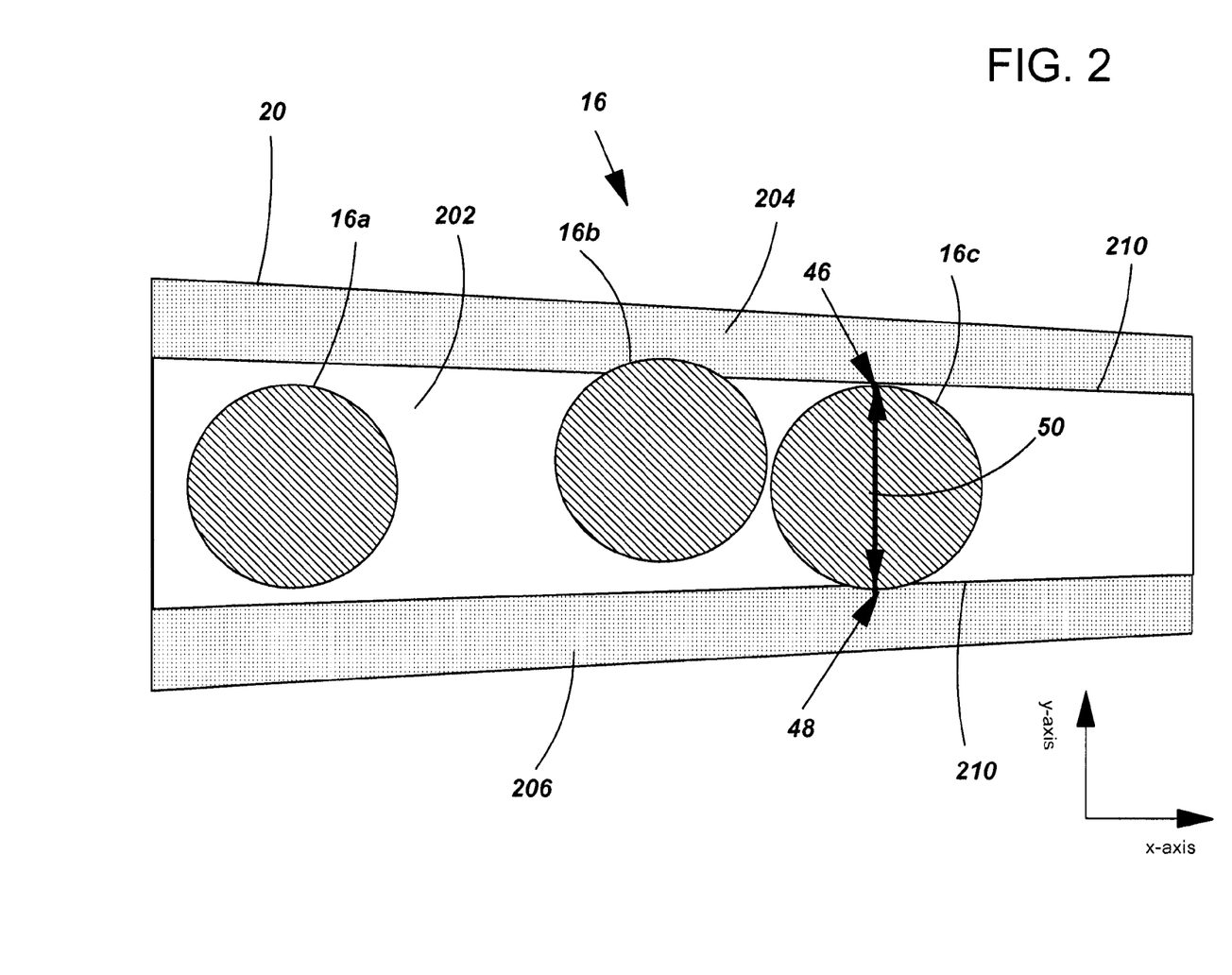
FIGS. 2-3 show embodiments of calibration targets for measuring a size of an optical spot.

FIG. 2 shows a calibration target 20 with multiple optical spots 16 thereon. Calibration target 20 includes a first portion 202, a second portion 204 and a third portion 206. Second portion 204 and third portion 206 extending along opposite sides 210, 212 of first portion 202, and are separated by first portion 202 in the y-axis. Second portion 204 and third portion 206 may further completely emborder first portion 202 (not shown). Second portion 204 and third portion 206 include a material of different optical response than that of first portion 202 such that when an optical spot 16 moves (partially or totally) from first portion 202 to at least one of second portion 204 or third portion 206, a change will be detected in the reflected beam collected by, e.g., tool 12. Within each portion, the optical response is substantially uniform.

Figure 3:
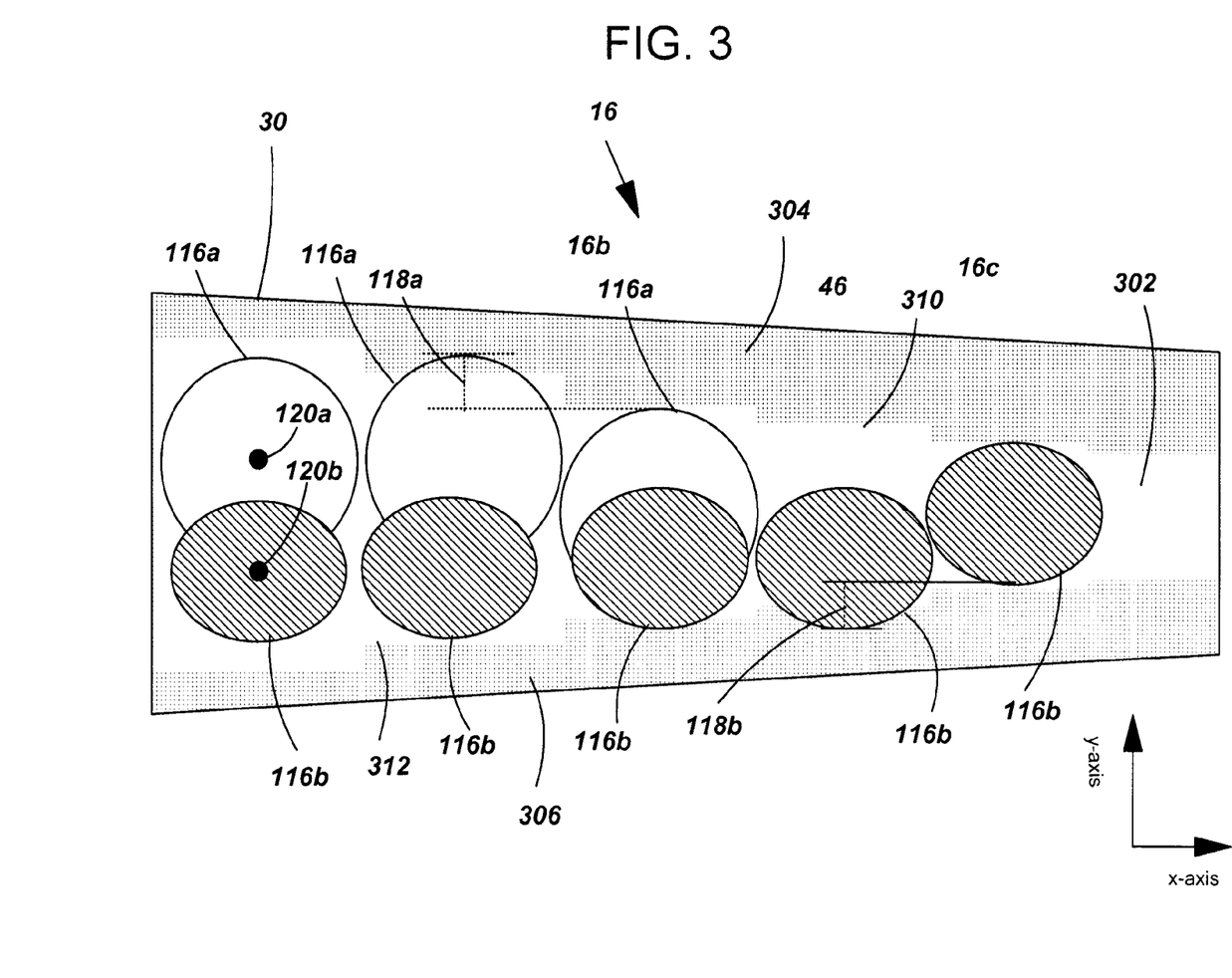

An y-axis dimension of first portion 202 in y-axis systematically decreases along x-axis. In this description, the term "systematic" is used for its meaning in statistics and is opposite to "random". A systematic variation is a non-random variation, e.g., continuous decreasing, continuous increasing, first increasing and then decreasing, gradient, etc. According to an embodiment, as shown in FIG. 2, the decreasing of the y-axis dimension is in a continuous manner such that, in a two-dimensional view, first portion 202 has a substantially trapezoidal shape. According to an alternative embodiment, as shown in FIG. 3, in a two-dimensional view, a first portion 302 of a calibration target 30 has a substantially stepped-side trapezoidal shape, i.e., it has two ladder-shaped borders 310, 312.

Figure 4:
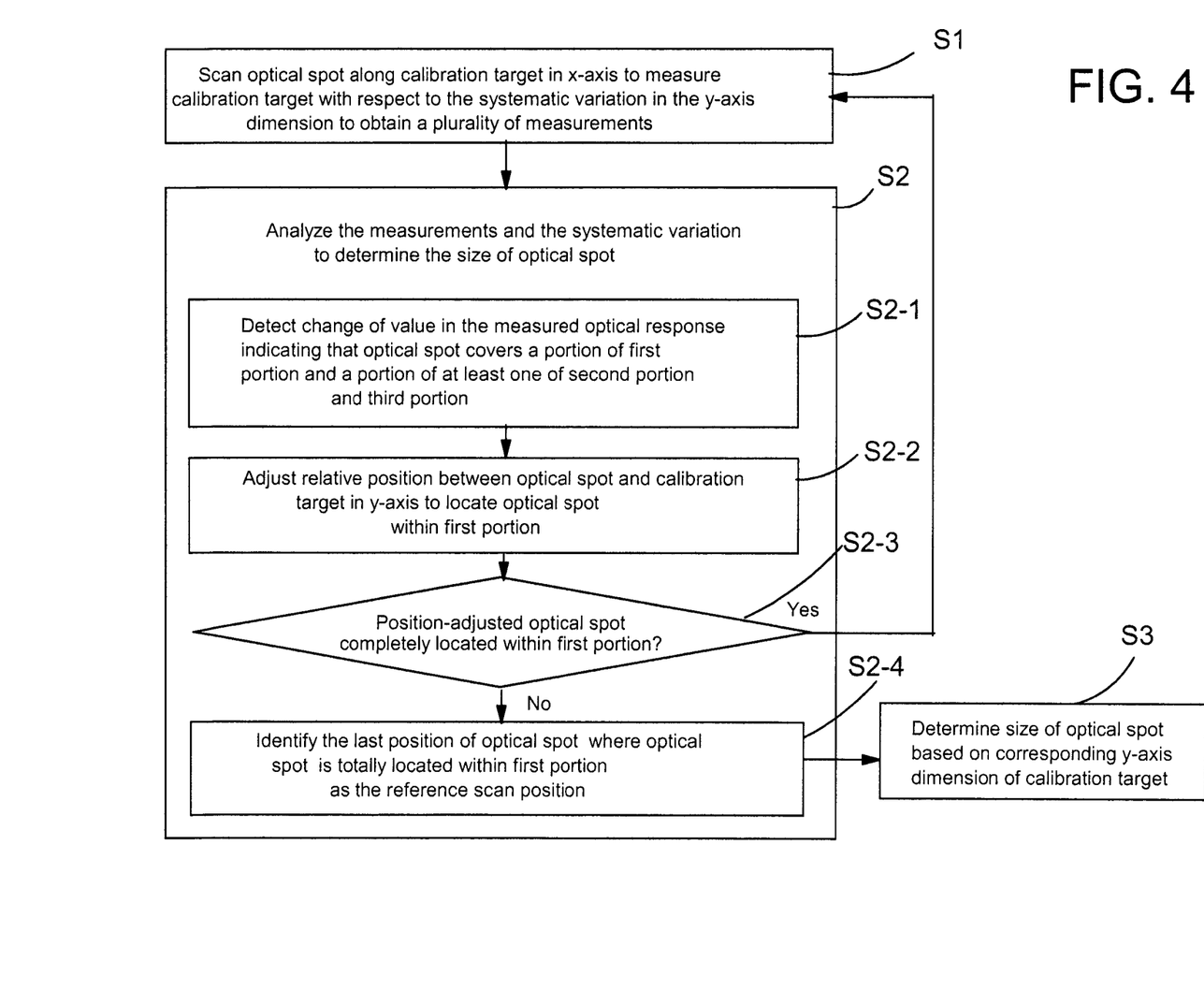
FIG. 4 shows embodiments of a method for measuring the size of the optical spot using calibration targets of FIGS. 2-3.

FIG. 4 shows, in a flow diagram, embodiments of a method for measuring a size of an optical spot 16 using calibration target 20. In the following description, calibration target 20 of FIG. 2 will be used as an example to describe the method of FIG. 4. It should be appreciated that calibration target 30 of FIG. 3 may be similarly used. Referring to FIGS. 1-2 and 4 collectively, in process S1, measurement controlling unit 26 and calibration target controlling unit 24 coordinate to control a tool 12 to measure calibration target 20 with respect to the systematic variation, i.e., the decreasing of the y-axis dimension, using the respective light beam 14 to obtain a plurality of measurements. Specifically, the measuring includes scanning light beam 14 along calibration target 20 in x-axis to make measurements of the optical response of calibration target 20. For example, at the beginning of the scan, optical spot 16 is positioned to be totally within first portion 202, as represented by optical spot 16a, and the scanning may follow the x-axis along which the y-axis dimension of calibration target 20 decreases. However, other scanning procedure is also possible. For example, optical spot 16 may be initially positioned to cover all three portions 202, 204 and 206, and the scanning may follow the direction that the y-axis dimension of calibration target 20 increases.

In process S2, analysis unit 28 analyzes the measurements and change of y-axis dimension of calibration target 20 to determine the size of optical spot 16. Specifically, analysis unit 28 relates a measurement of the optical response to a position of optical spot 16 with respect to first portion 202, second portion 204 and third portion 206 of calibration target 20 to identify a reference scan position of optical spot 16 where optical spot 16 is marginally located within first portion 202, i.e., optical spot 16 is substantially tangential to both borders 210, 212. That is, the "reference scan position" corresponds to a smallest y-axis dimension of first portion 202 that can still enclose optical spot 16. Any method may be used to identify the reference scan position, and all are included. For example, according to an embodiment, in sub-process S2-1, optical response monitor 40 detects a change of value in the measured calibration target 20 optical response indicating that optical spot 16 covers a portion of first portion 202 and a portion of at least one of second portion 204 and third portion 206. Optical spot 16b represents this situation.

In sub-process S2-2, relative scan position adjusting unit 42 adjusts a relative position between optical spot 16 and the calibration target 20 in the y-axis to locate optical spot 16 within first portion 202. For example, with respect to optical spot 16b, relative scan position adjusting unit 42 may instruct calibration target controlling unit 24 to move calibration target 202 upward or may instruct measurement controlling unit 26 to move optical spot 16b downward.

In sub-process S2-3, operation controlling unit 44 determines whether the position-adjusted optical spot 16 is completely located within first portion 202. If "yes", operation controlling unit 44 proceeds to process S-1. That is, the scanning, detecting and adjusting is continued from the current scan position of optical spot 16. If "no", in sub-process S2-4, analysis unit 44 identifies the last scan position of optical spot 16 where optical spot 16 is located completely within first portion 202 as the reference scan position.

In process S3, analysis unit 28 determines a size of optical spot 16 in the y-axis based on the dimension of first portion 202 in the y-axis which corresponds to the reference scan position. The corresponding dimension is the largest y-axis dimension of first portion 202 from a point in border 210 or 212 of first portion 202 which is closest to optical spot 16 in the reference scan position. For example, for optical spot 16c of FIG. 2, border point 46 and 48 are the closest points and dimension 50 is the corresponding dimension. FIG. 2 shows that the dimensions from border points 46 and 48 are the same, which is not necessary. For example, if optical spot 16 is not symmetric, dimensions from border points 46 and 48 may be different and the larger one will be identified as the corresponding dimension. The size of optical spot 16 in the y-axis will be determined as substantially equal to the corresponding dimension.

Following the similar procedure, size of optical spot 16 in other axis or direction may be determined. For example, calibration target 20 may be rotated 90 degrees and optical spot 16 will be scanned along the y-axis to determine an x-axis size of optical spot 16 following the similarly procedures described above.

According to an embodiment, analysis unit 28 may also determine a relative position between two optical spots 16 based on the adjusting in the y-axis made for each of the two optical spots 16. As shown in FIG. 3, e.g., if two optical spots 116a and 116b are adjusted differently (shown by different distances 118a, 118b) in the y-axis to reach the respective reference scan positions, it is determined that centers 120a and 120b of optical spots 116a and 116b, as before adjustments, are separated from one another in the y-axis.

In addition, processing system 22 may further determine a size of optical spot 16 using calibration targets with differences in another parameter different than the y-axis dimension to determine a variation of the determined size of optical spot 16 based on the difference in the another parameter. For example, processing system 22 may measure the size of optical spot 16 using calibration targets 20 of different combinations of optical responses, and/or critical dimensions to determine the possible variations in the measured sizes of optical spot 16.

3. Measuring Optical Spot Symmetry

Figure 5:
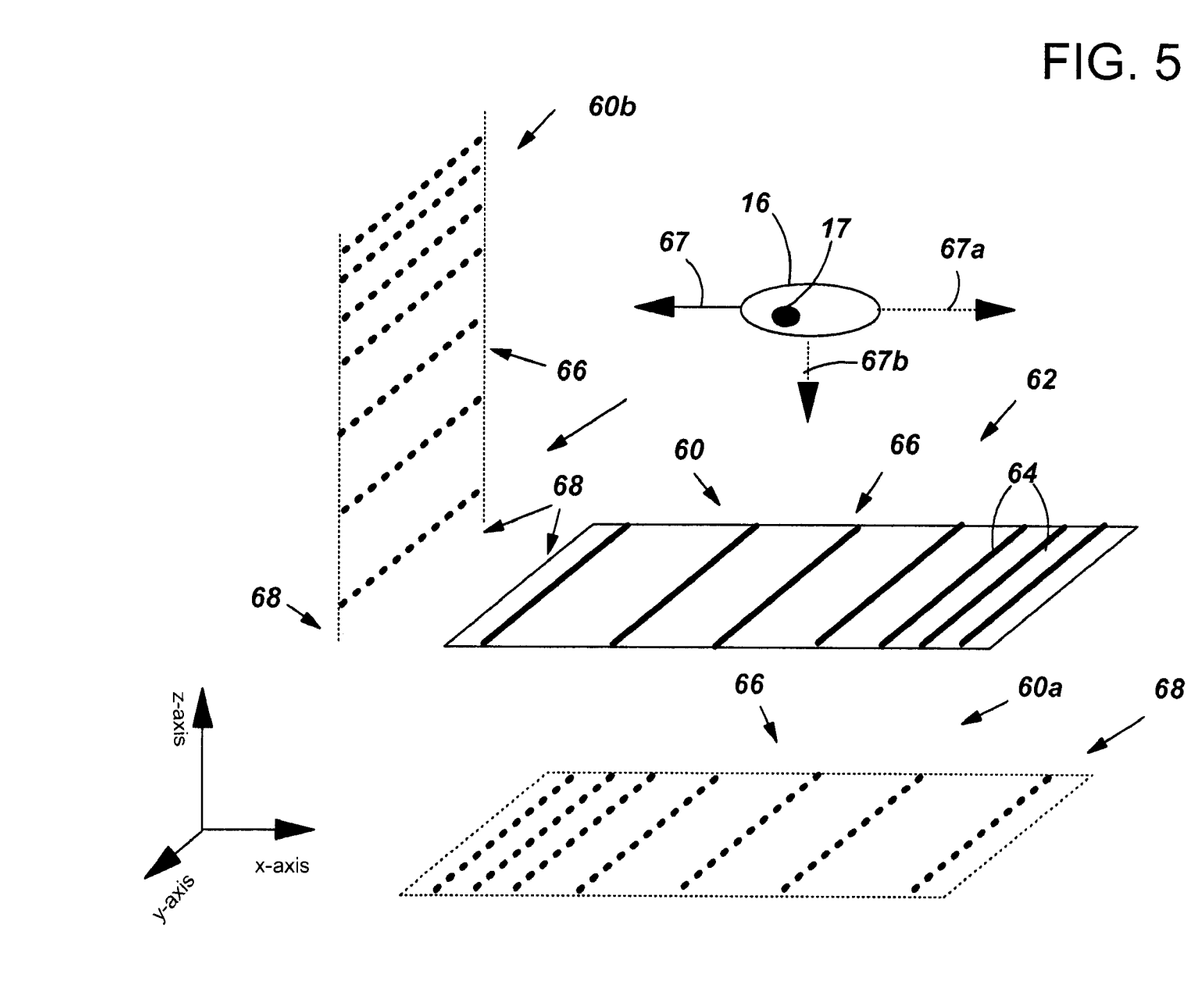
FIG. 5-6 show embodiments of calibration targets for measuring a level of symmetry of an optical spot.

FIG. 5 shows an embodiment of a calibration target 60 for measuring a level of symmetry of an optical spot 16. Calibration target 60 includes a gradient 62 in a parameter along the x-axis. The gradient parameter may be any parameter whose change can be detected by the effective spot of optical spot 16. For example, the parameter may be optical response, critical dimensions, height or depth of grating line, etc. In the current description, a density of grating lines 64 (hereinafter "density") of calibration target 60 may be used for the gradient parameter. Preferably, the density gradient is a function of the x-axis.

Figure 6:
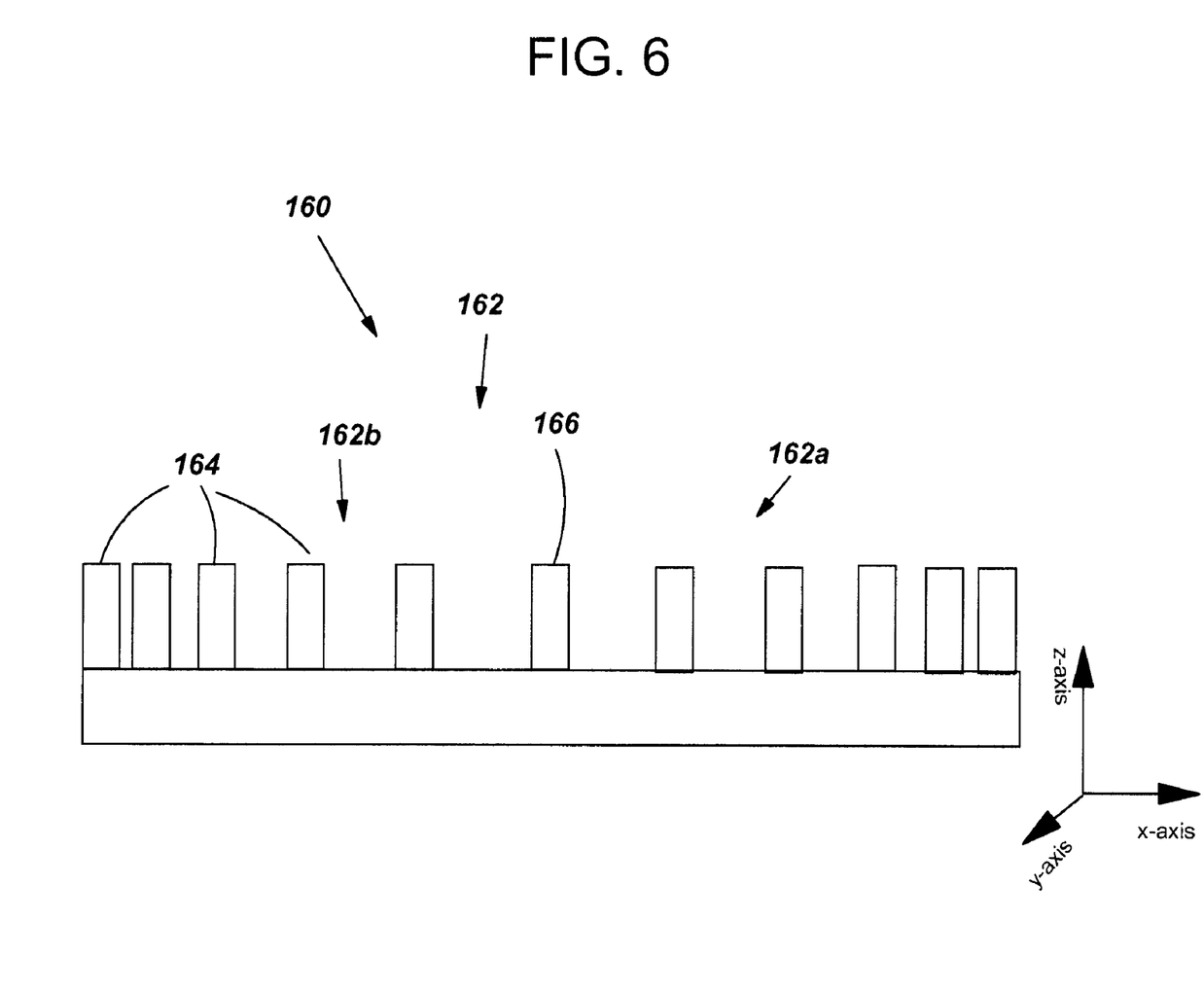

According to an embodiment, as shown in FIG. 5, the density gradient 62 is continuous from one end of calibration target 60 to another end thereof in the x-axis. According to an another embodiment, as shown in FIG. 6, the density gradient 162 includes two sub-gradients 162a and 162b separated by a switch point 166 in a given point in x-axis, e.g., in the center of calibration target 160. Along the x-axis, sub-gradient 162a is an ascending gradient (i.e., density increasing along the x-axis), and sub-gradient 162b is a descending one (i.e., density decreasing along the x-axis).

Figure 7:
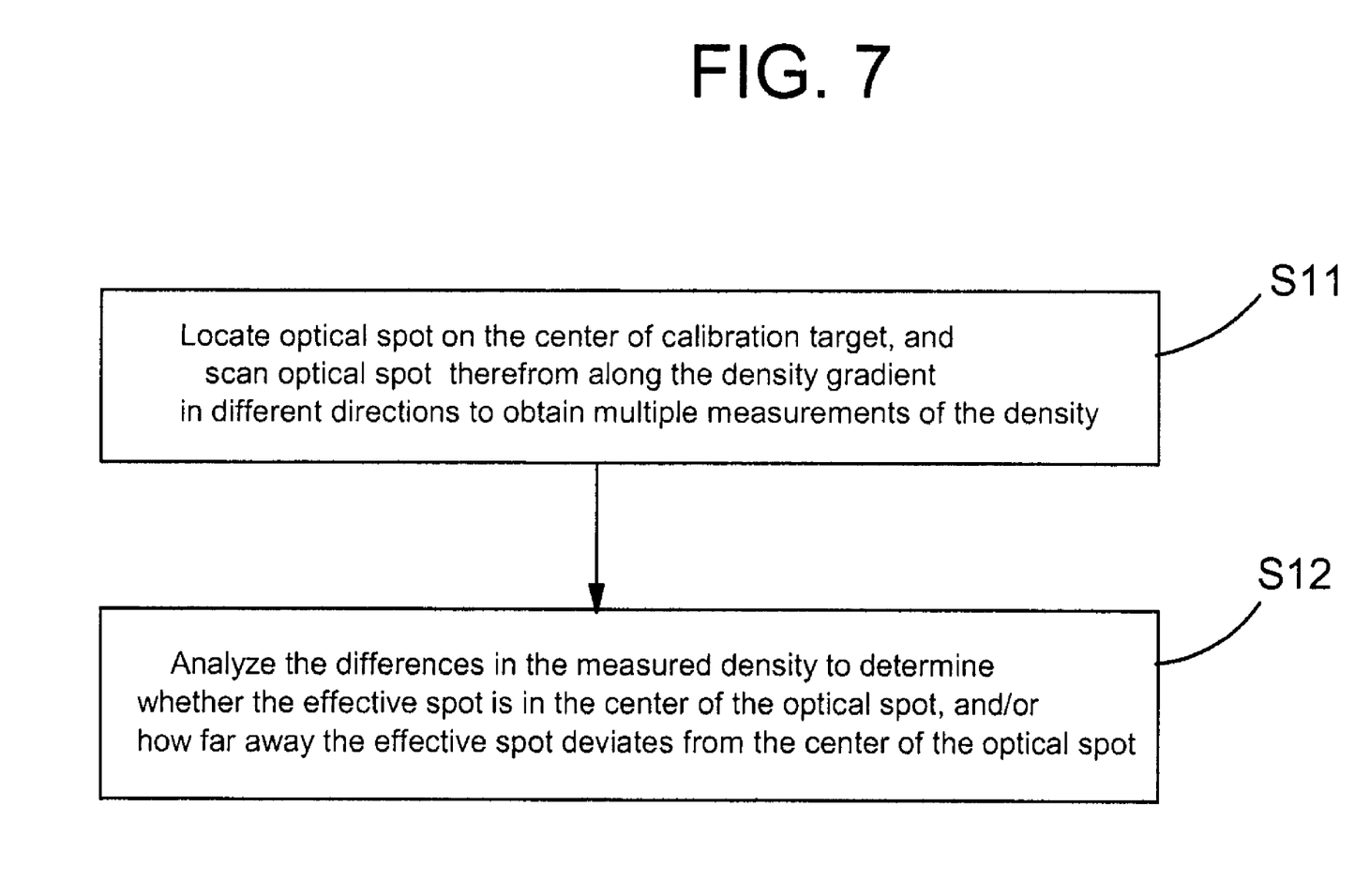
FIG. 7 shows embodiments of a method for measuring the level of symmetry of the optical spot using calibration targets of FIGS. 5-6.

FIG. 7 shows embodiments of a method for measuring a level of symmetry of optical spot 16. A level of symmetry is determined based on whether the effective spot is in the center of the optical spot and how far away the effective spot deviates from the center of the optical spot. Referring to FIGS. 1, 5 and 7, in process S11, measurement controlling unit 26 locates optical spot 16 with an effective spot 17 on a given point, e.g., the center 66, and scans optical spot 16 from the given point along gradient 62 or 162 in different directions to obtain multiple measurements of the density. In process S12, analysis unit 28 analyzes the differences in the measured density to determine whether effective spot 17 is in the center of optical spot 16, and/or how far away effective spot 17 deviates from the center of optical spot 16. Any method may be used in the analysis, and all are included. For example, where calibration target 60 is used for the measurement, measurement controlling unit 26 may scan optical spot 16 from center 66 to the low density end 68 (as shown by arrow 67) along the x-axis and obtain a first set of measurements. Then, calibration target controlling unit 24 may position calibration target 60 with a 180 degree rotation as shown in phantom 60a. Measurement controlling unit 26 may scan optical spot 16 from center 66 to the low density end 68 (as shown by dotted arrow 67a along the x-axis) and obtain a second set of measurements. If the second set of measurements does not match the first set of measurements, it can be determined that effective spot 17 is not located in the center of optical spot 16. Alternatively, calibration target controlling unit 24 may position calibration target 60 with a 90 degree rotation as shown in phantom 60b. Measurement controlling unit 26 may scan optical spot 16 from center 66 to the low density end 68 (as shown by dotted arrow 67b along the z-axis) and obtain a third set of measurements. If the third set of measurements does not match the first set of measurements, it can be determined that effective spot 17 is not located in the center of optical spot 16. In addition, by comparing the differences in the different sets of measurement, analysis unit 28 may be able to determine how far away effective spot 17 deviates from the center of optical spot 16.

Referring to FIGS. 1 and 6-7, where calibration target 160 is used, measurement controlling unit 26 may first locate optical spot 16 in the center 166 of calibration target 160 and scan optical spot 16 from center 166 to both sides along sub-gradient 162a and 162b in x-axis. If measurements from both sides of the scanning show increases in the density, it is determined that the effective spot 17 (FIG. 5) is in the center of optical spot 16 (FIG. 5). If measurements from one side of scanning show a switch point (e.g., change from density decreasing to density increasing) in the density, it is determined that the effective spot 17 (FIG. 5) is not in the center of optical spot 16 (FIG. 5). In addition, by relating the detected switch point to the scan position of optical spot 16, analysis unit 28 may be able to determine how far away effective spot 17 (FIG. 5) deviates from the center of optical spot 16 (FIG. 5).

The determined geometric parameter of optical spot 16, e.g., size, level of symmetry, may be output to, e.g., tool matching unit 29 for matching tools 12 based on the respective optical spot 16 geometric parameters. For example, tool matching unit 29 may adjust the measurements of each tools 12 based on the respective sizes and/or levels of symmetry of optical spots 16. Tool matching unit 29 may also physically adjust each tool 12 regarding the optical spot 16 geometric parameters. Other uses of the determined sizes and/or levels of symmetry of light beams 14 of tools 12 are also possible and included in the disclosure. For example, the calibration targets described above may be used in a semi real time feedback control system to measure geometric parameters of optical spots during system manufacturing, optics alignment and preventive maintenance.

According to an embodiment, processing system 22 may be implemented by a computer system. The computer system can comprise any general purpose computing article of manufacture capable of executing computer program code installed thereon to perform the process described herein. The computer system can also comprise any specific purpose computing article of manufacture comprising hardware and/or computer program code for performing specific functions, any computing article of manufacture that comprises a combination of specific purpose and general purpose hardware or software, or the like. In each case, the program code and hardware can be created using standard programming and engineering techniques, respectively.

4. Conclusion

While shown and described herein as a method and system for determining a geometric parameter of an optical spot of a light beam, it is understood that the disclosure further provides various alternative embodiments. For example, in an embodiment, the disclosure provides a program product stored on a computer-readable medium, which when executed, enables a computer infrastructure to determine a geometric parameter of an optical spot of a light beam. To this extent, the computer-readable medium includes program code, which may be installed to a computer system to implement, e.g., processing system 22 (FIG. 1), to implement the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as a memory and/or a storage system and/or as a data signal traveling over a network (e.g., during a wired or wireless electronic distribution of the program product).

It should be appreciated that the teachings of the present disclosure could be offered as a business method on a subscription or fee basis. For example, a system 10 (FIG. 1) including processing system 22 and calibration targets 20, 30, 60 and 160 could be created, maintained and/or deployed by a service provider that offers the functions described herein for customers. That is, a service provider could offer to determine a geometric parameter of an optical spot of a light beam as described above.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and or or (c) decompression. To this extent, program code can be embodied as one or more types of program products, such as an application or software program, component software or a library of functions, an operating system, a basic 1 or 0 system or driver for a particular computing and/or 1 or 0 device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and or or flowchart illustration, and combinations of blocks in the block diagrams and or or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

What is claimed is:

1. A method for determining a geometric parameter of an optical spot of a light beam, the method comprising:
   providing a calibration target, the calibration target including a systematic variation in a parameter;
   measuring the calibration target with respect to the systematic variation using the light beam to obtain a plurality of measurements; and
   analyzing the measurements and the systematic variation to determine the geometric parameter of the optical spot;
   wherein in the case that the geometric parameter includes a size of the optical spot, the calibration target includes a first portion, a second portion and a third portion, a dimension of the first portion in a first axis systematically decreasing along a second axis, the second portion and the third portion extending along opposite sides of the first portion and being separated by the first portion in the first axis and including a material of different optical response than that of the first portion, and the measuring including scanning the light beam along the calibration target in the second axis to make measurements of the calibration target, and the analyzing including:
      relating a measurement to a position of the optical spot with respect to the first portion, second portion and the third portion of the calibration target to identify a reference scan position of the optical spot where the optical spot is marginally located within the first portion;
      and determining a size of the optical spot in the first axis based on a corresponding dimension of the first portion in the first axis, the identifying including:
         detecting a change of value in the measurements indicating that the optical spot covers a portion of the first portion and a portion of at least one of the second portion and the third portion;
         adjusting a relative position between the optical spot and the calibration target in the first axis to locate the optical spot within the first portion; and
         continuing the scanning, detecting, and adjusting until identifying the reference scan position;
   wherein in the case that the geometric parameter includes a level of symmetry of the optical spot, the calibration target including a gradient in a parameter along an axis, the gradient being a function of the axis, and the analyzing including analyzing differences in the measurements to determine the level of symmetry, the measuring including:
      locating the optical spot on a given point of the gradient; and
      scanning the optical spot from the given point along the gradient tin different directions to obtain the measurements;
   and the calibration target including one of:
      a continuous gradient from one end of the calibration target to another end thereof in the axis; or
      a switch point in a given point of the calibration target in the axis between two sub-gradients, one of the two sub-gradients being an ascending gradient and another of the two sub-gradient being a descending gradient.

2. The method of claim 1, further comprising determining a relative position between two optical spots based on the adjusting in the first axis made for each of the two optical spots.

3. The method of claim 1, further comprising determining a size of the optical spot using calibration targets with differences in another different parameter to determine a variation of the determined size of the optical spot with the difference in the another parameter.

4. A system for determining a geometric parameter of an optical spot of a light beam, the method comprising:
   means for controlling a calibration target, the calibration target including a systematic variation in a parameter;
   means for measuring the calibration target with respect to the systematic variation using the light beam to obtain a plurality of measurements; and
   means for analyzing the measurements and the systematic variation to determine the geometric parameter of the optical spot;
   wherein in the case that the geometric parameter includes a size of the optical spot, the calibration target includes a first portion, a second portion and a third portion, a dimension of the first portion in a first axis systematically decreasing along a second axis, the second portion and the third portion extending along opposite sides of the first portion and being separated by the first portion in the first axis and including a material of different optical response than that of the first port ion, the measuring means scanning the light beam along the calibration target in the second axis to make measurements of the calibration target, and the analyzing means:
      relating a measurement to a position of the optical spot with respect to the first portion, second portion and the third portion of the calibration target to identify a reference scan position of the optical spot where the optical spot is marginally located within the first portion;
      determining a size of the optical spot in the first axis based on a corresponding dimension of the first portion in the first axis;
      detecting a change of value in the measurements indicating that the optical spot covers a portion of the first portion and a portion of at least one of the second portion and the third portion;
      controlling adjusting a relative position between the optical spot and the calibration target in the first axis to locate the optical spot within the first portion; and
      controlling continuing the scanning, detecting, and adjusting until identifying the reference scan position;
   wherein in the case that the geometric parameter includes a level of symmetry of the optical spot, the calibration target includes a gradient in a parameter along an axis, the gradient being a function of the axis, and the analyzing means analyzines differences in the measurements to determine the level of symmetry, and the measuring means:
      locates the optical spot on a given point of the gradient; and
      scans the optical spot from the given point along the gradient tin different directions to obtain the measurements.

5. The system of claim 4, wherein the analyzing means further determines a relative position between two optical spots based on the adjusting in the first axis made for each of the two optical spots.

6. The system of claim 4, further comprising means for controlling determining a size of the optical spot using calibration targets with differences in another different parameter to determine a variation of the determined size of the optical spot with the difference in the another parameter.

7. The system of claim 4, wherein the calibration target includes one of:
   a continuous gradient from one end of the calibration target to another end thereof in the axis; or
   a switch point in the given point of the calibration target in the axis between two sub-gradients, one of the two sub-gradients being an ascending gradient and the other being a descending gradient.

* * * * *